United States Patent
Kanno et al.

(10) Patent No.: US 9,608,072 B2
(45) Date of Patent: Mar. 28, 2017

(54) SEMICONDUCTOR DEVICE

(71) Applicant: FUJI ELECTRIC CO., LTD., Kawasaki (JP)

(72) Inventors: Hiroshi Kanno, Matsumoto (JP); Hitoshi Sumida, Tokyo (JP); Masaharu Yamaji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/792,027

(22) Filed: Jul. 6, 2015

(65) Prior Publication Data

US 2016/0056148 A1   Feb. 25, 2016

(30) Foreign Application Priority Data

Aug. 19, 2014 (JP) ................. 2014-166567

(51) Int. Cl.
*H01L 29/10* (2006.01)
*H01L 29/739* (2006.01)
*H01L 29/06* (2006.01)
*H01L 27/02* (2006.01)

(52) U.S. Cl.
CPC ...... *H01L 29/1095* (2013.01); *H01L 27/0266* (2013.01); *H01L 29/0696* (2013.01); *H01L 29/7395* (2013.01)

(58) Field of Classification Search
CPC ............ H01L 29/7809; H01L 29/7818; H01L 29/7819; H01L 29/7804; H01L 29/7805; H01L 27/0255

See application file for complete search history.

(56) References Cited

U.S. PATENT DOCUMENTS

| | | | | |
|---|---|---|---|---|
| 4,967,243 A | * | 10/1990 | Baliga | H01L 27/0727 257/121 |
| 5,572,055 A | * | 11/1996 | Sumida | H01L 29/0696 257/133 |
| 6,674,126 B2 | * | 1/2004 | Iwamoto | H01L 29/7802 257/329 |
| 6,855,985 B2 | * | 2/2005 | Williams | H01L 21/26513 257/338 |
| 6,870,223 B2 | * | 3/2005 | Kumagai | H01L 27/0255 257/328 |
| 7,741,661 B2 | * | 6/2010 | Disney | H01L 21/76264 257/272 |
| 7,767,528 B2 | * | 8/2010 | Muller | H01L 29/0696 257/343 |

(Continued)

FOREIGN PATENT DOCUMENTS

JP   2004-47937   2/2004
WO   WO 2014/058028 A1   4/2014

*Primary Examiner* — Matthew Landau
*Assistant Examiner* — Grant Withers (57) ABSTRACT

A semiconductor device is provided with a first well region of a first conduction type having a first voltage (voltage VB) applied thereto, a second well region of a second conduction type formed in the surface layer section of the first well region and having a second voltage (voltage VS) different from the first voltage applied thereto, and a charge extracting region of the first conduction type formed in the surface layer section of the second well region and having the first voltage applied thereto. This inhibits the operation of a parasitic bipolar transistor.

16 Claims, 7 Drawing Sheets

(56) References Cited

U.S. PATENT DOCUMENTS

| | | | |
|---|---|---|---|
| 8,148,785 B2* | 4/2012 | Yamaji | H01L 27/0883 257/369 |
| 8,633,563 B2* | 1/2014 | Yamaji | H01L 21/761 257/499 |
| 8,686,513 B1* | 4/2014 | Seok | H01L 29/4238 257/379 |
| 9,013,844 B2* | 4/2015 | Karp | H01L 27/0251 361/56 |
| 9,070,735 B2* | 6/2015 | Pathirana | H01L 29/7393 |
| 9,236,460 B2* | 1/2016 | Koyama | H01L 29/7393 |
| 9,263,619 B2* | 2/2016 | Willemen | H01L 27/0255 |
| 2003/0218186 A1* | 11/2003 | Hano | H01L 27/0629 257/197 |
| 2012/0061726 A1* | 3/2012 | Tokura | H01L 29/0696 257/141 |

\* cited by examiner

SEMICONDUCTOR DEVICE

CROSS-REFERENCE TO RELATED APPLICATIONS

This application is based on, and claims priority to, Japanese Patent Application No. 2014-166567, filed on Aug. 19, 2014, the content of which is incorporated herein by reference in its entirety.

BACKGROUND

1. Field

The present disclosure relates to a semiconductor device and particularly to a power integrated circuit (power IC) provided with a driving circuit for driving a switching element on the high-side.

2. Description of Related Art

In mainly a low capacity inverter, for driving a switching element forming a bridge circuit for power conversion, a high breakdown voltage IC (HVIC) is used as a semiconductor device. The high breakdown voltage IC is generally provided with circuits such as a high-side driving circuit, a low-side driving circuit, a level shift circuit and a control circuit. The high breakdown voltage IC, in response to a signal inputted to the input terminal thereof, outputs a driving signal from the output terminal thereof which signal is inputted to the gate of the switching element and drives the switching element by turning-on and -off the element. In the bridge circuit for power conversion, the switching element in the high-side driving circuit is operated by receiving the signal from the high breakdown voltage IC, by which power conversion is carried out.

A high-side driving circuit is formed of a CMOS (complementary MOS) circuit with a p-channel MOSFET (insulated gate field effect transistor) and an n-channel MOSFET connected so as to be complementary to each other. The p-channel MOSFET is formed in an n-well region provided in a surface layer section of a p-type semiconductor substrate. The n-channel MOSFET is formed in a p-well region provided in a surface layer section of an n-well region.

The high-side driving circuit driving a high-side circuit is operated with a voltage VS taken as a reference voltage and with a voltage VB taken as a power supply voltage to output a driving signal from an output terminal on the basis of a signal received from the level shift circuit. The voltage VB is the highest voltage applied to the high breakdown voltage IC which voltage is kept to be on the order of 15V higher than the voltage VS by a bootstrap capacitor etc. in a normal state unaffected by noises.

The voltage VS is the voltage at the connection point (output node section) of a high voltage side switching element and a low voltage side switching element in a bridge circuit for power conversion. The voltage VS varies in the process of power conversion between zero volt and hundreds of volts and sometimes becomes a negative voltage.

In such a high breakdown voltage IC, various kinds of noises are inputted thereto which are produced by the operations of the switching elements. Thus, it is important to design a high breakdown voltage IC that withstands such noises to cause no malfunction and no inoperativeness. For enhancing noise withstanding capability, it is necessary to inhibit the operation of parasitic elements and, in particular, it is important to inhibit the operation of a parasitic element formed in the longitudinal direction of a substrate directly below a high-side region (around a high-voltage side switching element driving circuit). This is because a parasitic element formed in the longitudinal direction of a substrate has a large area that makes a large current easily flow therein.

In Patent Application Publication JP-A-2004-47937 (US 2003/0218186), a technology is disclosed which inhibits the operation of a parasitic pnp transistor by providing an n-type high impurity concentration buried layer between a p-type semiconductor substrate and an n-type semiconductor layer.

In Patent Application Publication WO2014/058028, a technology is disclosed which inhibits the operation of a parasitic pnp transistor due to a negative voltage surge by providing a p-channel MOSFET for clamping in an n-type well region.

It is an aspect of the invention to provide a new semiconductor device which inhibits the operation of a parasitic bipolar transistor in a high side driving circuit forming region.

SUMMARY

In a semiconductor device according to embodiments of the invention, the device includes a first well region of a first conduction type to which a first voltage is applied, a second well region of a second conduction type which is formed on the surface layer section of the first well region and to which a second voltage different from the first voltage is applied, and a charge extracting region of the first conduction type which is formed on the surface layer section of the second well region and to which the first voltage is applied.

According to embodiments of the invention, a semiconductor device can be provided which inhibits an operation of a parasitic bipolar transistor.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

In the following, semiconductor devices according to embodiments of the invention will be explained in detail with reference to the attached drawings.

In the explanation in the specification, a "main electrode region" means a semiconductor region with a low specific resistance which is to be either a source region or a drain region in a field effect transistor (FET) or a static induction transistor (SIT). The "main electrode region" means a semiconductor region with a low specific resistance which is to be one of an emitter region and a collector region in an IGBT. Therefore, the specific name of the "main electrode region" depends on the kind of the "semiconductor device" in which the "region" is provided. More specifically, when the "semiconductor region which is to be one" is defined as a "first main electrode region", "the other semiconductor region" becomes a "second main electrode region". That is, the "second electrode region" means a semiconductor region to be either a source region or a drain region that becomes no first main electrode region in an FET or an SIT, and means a semiconductor region to be either an emitter region or a collector region that becomes no first main electrode region in an IGBT. In each of the following embodiments, explanations will be made by giving attention to a power IC using insulated gate field effect transistors. Thus, each of the source region thereof will be referred to as a "first main electrode region" and each of the drain regions thereof will be referred to as a "second main electrode region".

With respect to each of the following embodiments, explanations will be made with the case, in which a first conduction type is an n-type and a second conduction type is a p-type, taken as an example. However, the conduction types may be selected in such a reversed relation that the first conduction type is the p-type and the second conduction type is the n-type.

Moreover, in the specification and the attached drawings, a leading character "n" attached to the name of a layer or a region means that electrons are major carriers in the layer or the region and a leading character "p" attached to the name of a layer or a region means that holes are major carriers in the layer or the region. In addition, a sign "+" attached to the leading character "n" or "p" means that the impurity concentration in the layer or the region is higher than that in the layer or the region without the sign and a sign "−" attached to the leading character "n" or "p" means that the impurity concentration in the layer or the region is lower than that in the layer or the region without the sign.

Furthermore, in the explanations of the embodiments and in the attached drawings, similar arrangements will be denoted with the same reference numerals and signs with redundant explanations thereof being omitted. In addition, in the attached drawings with reference to which the embodiments will be explained are drawn neither to an accurate scale nor with an accurate dimensional proportion for the purpose of making the drawn items easy to see and easy to understand. The invention is not limited to the descriptions of a first to a fourth embodiments explained in the following unless the descriptions depart from the spirit and scope of the invention.

(First Embodiment)

Figure 1:
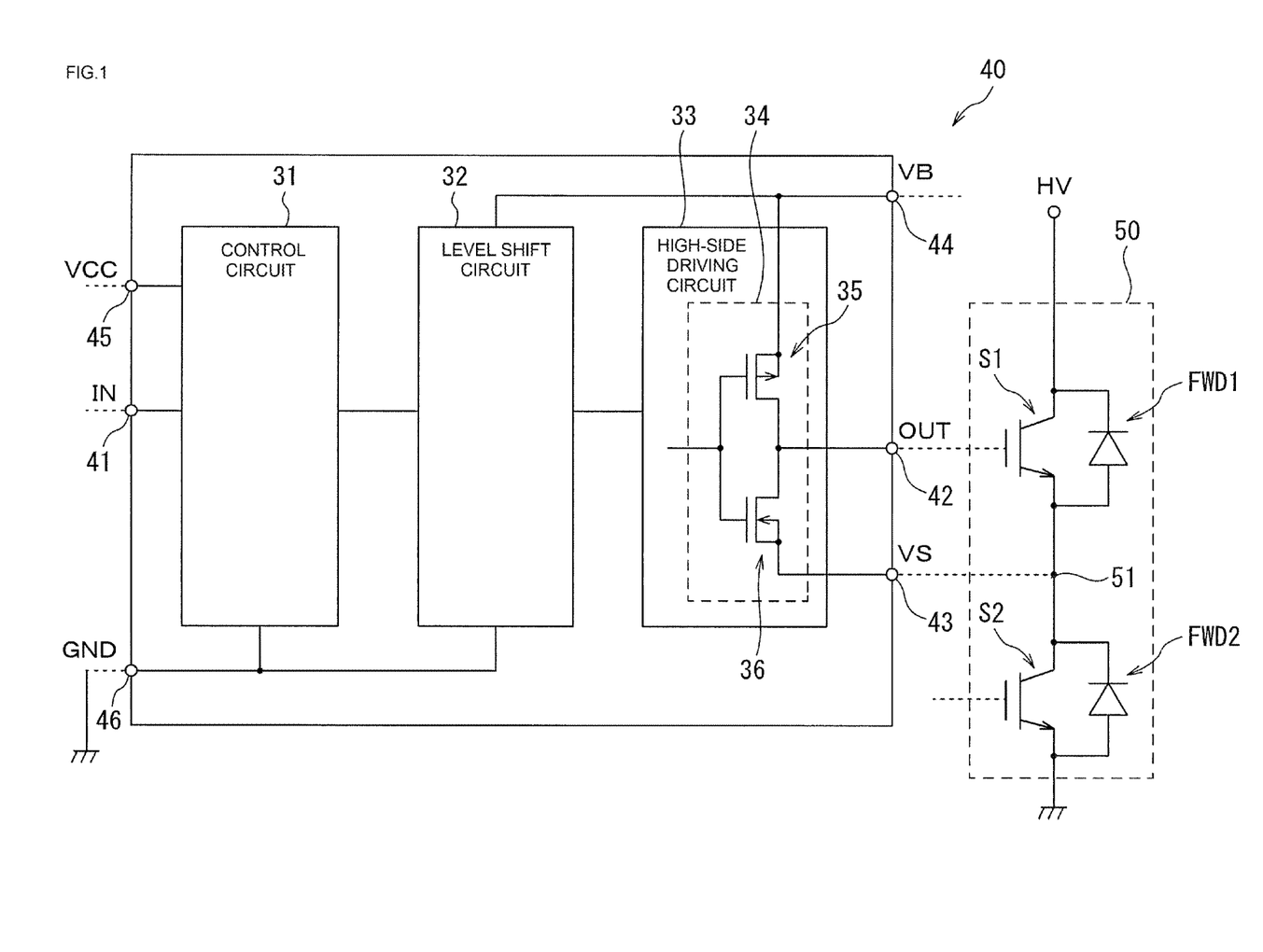
FIG. 1 is a circuit diagram showing a schematic configuration of a semiconductor device according to a first embodiment of the invention.

FIG. 1 is a circuit diagram showing a schematic configuration of a semiconductor device 40 according to a first embodiment of the invention.

As is shown in FIG. 1, the semiconductor device 40 according to the first embodiment of the invention is a power IC provided with a control circuit 31, a level shift circuit 32, a high-side driving circuit 33 and a low-side driving circuit (not shown). The semiconductor device 40 is, for example, a power IC that drives a power converting section 50 for one phase of a power conversion bridge circuit as a driving object.

The power converting section 50 forms a high-side circuit with a high voltage side switching element S1 and a low voltage side switching element S2 connected in series. Each of the high voltage side switching element S1 and the low voltage side switching element S2 is formed with an active element such as an IGBT or a MOSFET, for example. The high voltage side switching element S1 has a free-wheeling diode FWD1 connected in inverse parallel thereto and the low voltage side switching element S2 has a free-wheeling diode FWD2 connected in inverse parallel thereto.

The high voltage side switching element S1 and the low voltage side switching element S2 are connected in series between a main power supply HV (on the positive side) at a high voltage and the ground GND on the negative side of the main power supply. A VS terminal 43, to which a voltage VS as a second voltage is applied, is connected to a connection point 51 of the high voltage side switching element S1 and the low voltage side switching element S2. The connection point 51 is an output point of the power converting section 50 for one phase of a power conversion bridge circuit to which point a load such as a motor, for example, is connected.

When the semiconductor device 40 is in operation, the high voltage side switching element S1 and the low voltage side switching element S2 both forming the high-side circuit are complimentarily turned-on and -off to thereby causing the voltage VS applied to the VS terminal 43 to repeat an increase and a decrease between the voltage of the main power supply HV (on the order of 400V, for example) on the high voltage side and the ground GND on the low voltage side to vary between 0V to hundreds of volts.

The high-side driving circuit 33 is provided with a gate driving circuit 34. The gate driving circuit 34 is formed with a CMOS circuit in which an n-channel MOSFET (hereinafter referred to as an nMOS) 36, for example, and a p-channel MOSFET (hereinafter referred to as a pMOS) 35, for example, are complimentarily connected in series. The nMOS 36 is provided as a first field effect transistor of the first conduction type and the pMOS 35 is provided as a second field effect transistor of the second conduction type. Specifically, the source of the pMOS 35 is connected to a VB terminal 44 and the drain of the pMOS 35 is connected to the drain of the nMOS 36. The source of the nMOS 36 is connected to the VS terminal 43.

The gate driving circuit 34 is operated with the voltage VS applied to the VS terminal 43 taken as a reference voltage and with a voltage VB as a first voltage applied to the VB terminal 44 taken as a power supply voltage to output a driving signal from an output terminal 42 on the basis of a signal received from the level shift circuit 32 to thereby drive the high voltage side switching element S1.

The control circuit 31 is operated with the GND (ground) electric potential at a GND (grounding) terminal 46 taken as a reference potential and with a voltage VCC applied to a VCC terminal 45 taken as a power supply voltage to produce an on-off signal at a low-side level for turning-on and -off the high voltage side switching element S1 and an on-off signal at a low-side level for turning-on and -off the low voltage side switching element S2.

The level shift circuit 32 converts the on-off signal at the low-side level produced by the control circuit 31 to the on-off signal at the high-side level.

In the semiconductor device 40 according to the first embodiment, when the high voltage side switching element S1 is driven, the on-off signal at the low-side level for turning-on and -off the high voltage side switching element S1 is produced by the control circuit 31. The on-off signal at the low-side level is converted by the level shift circuit 32 to the on-off signal at the high-side level before being inputted to the high-side driving circuit 33.

The on-off signal inputted to the high-side driving circuit 33 from the control circuit 31 is further inputted to the gate of the high voltage side switching element S1 through the gate driving circuit 34. The high voltage side switching element S1 is turned-on and -off on the basis of the on-off signal from the control circuit 31.

The voltage VB is the highest voltage applied to the semiconductor device 40 which voltage is kept to be on the order of 15V higher than the voltage VS by a bootstrap capacitor etc. in a normal state unaffected by noises. The voltage VS is the voltage at the connection point (output node section) 51 of the high voltage side switching element S1 and the low voltage side switching element S2 in a bridge circuit for power conversion. The voltage VS varies in the process of power conversion between zero volt and hundreds of volts and sometimes becomes a negative voltage.

In the next, the specific structure of the semiconductor device 40 according to the first embodiment will be explained.

Figure 2:
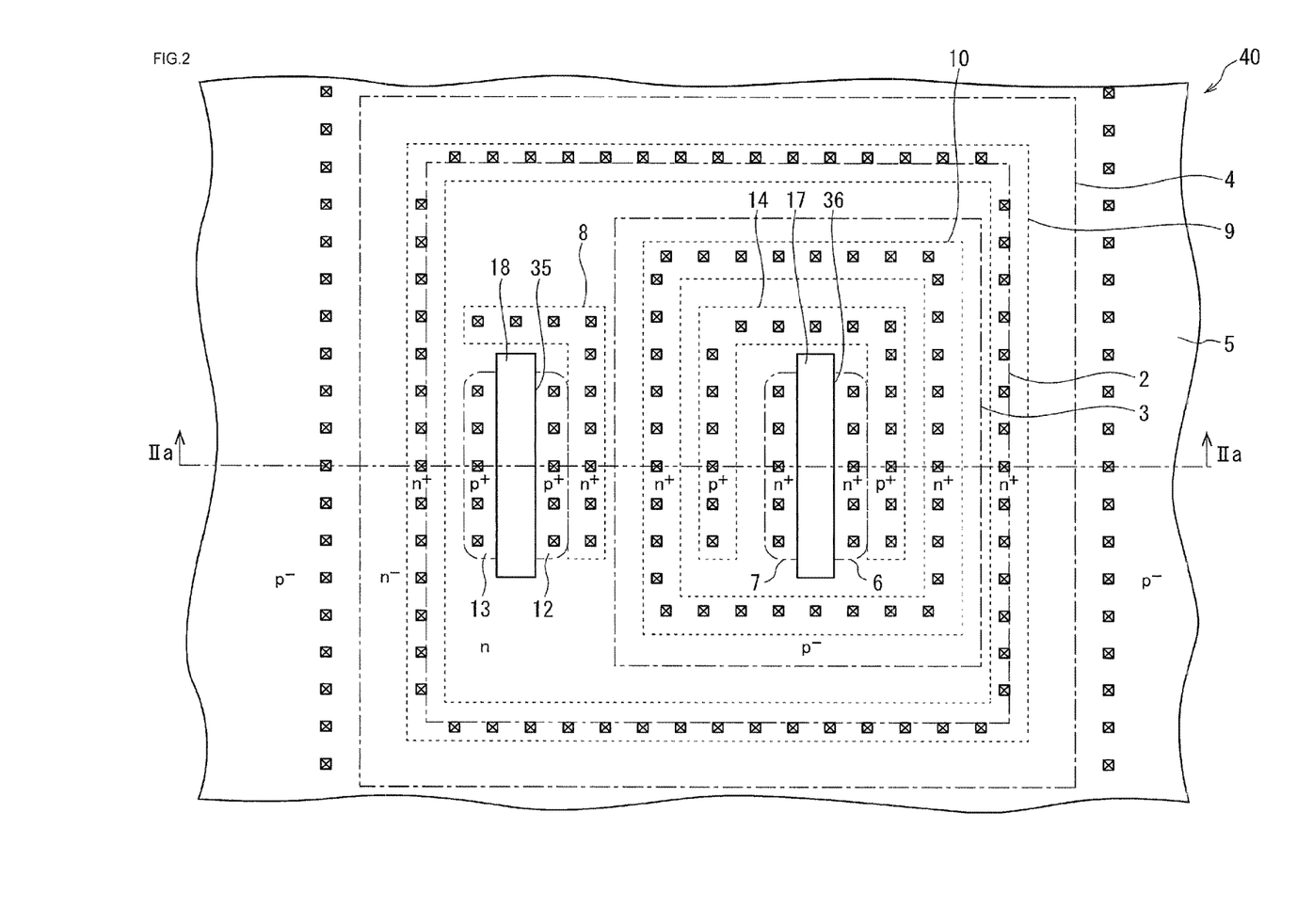
FIG. 2 is a plan view showing a layout of semiconductor regions in a high-side forming region in the principal part of the semiconductor device according to the first embodiment of the invention.
Figure 3:
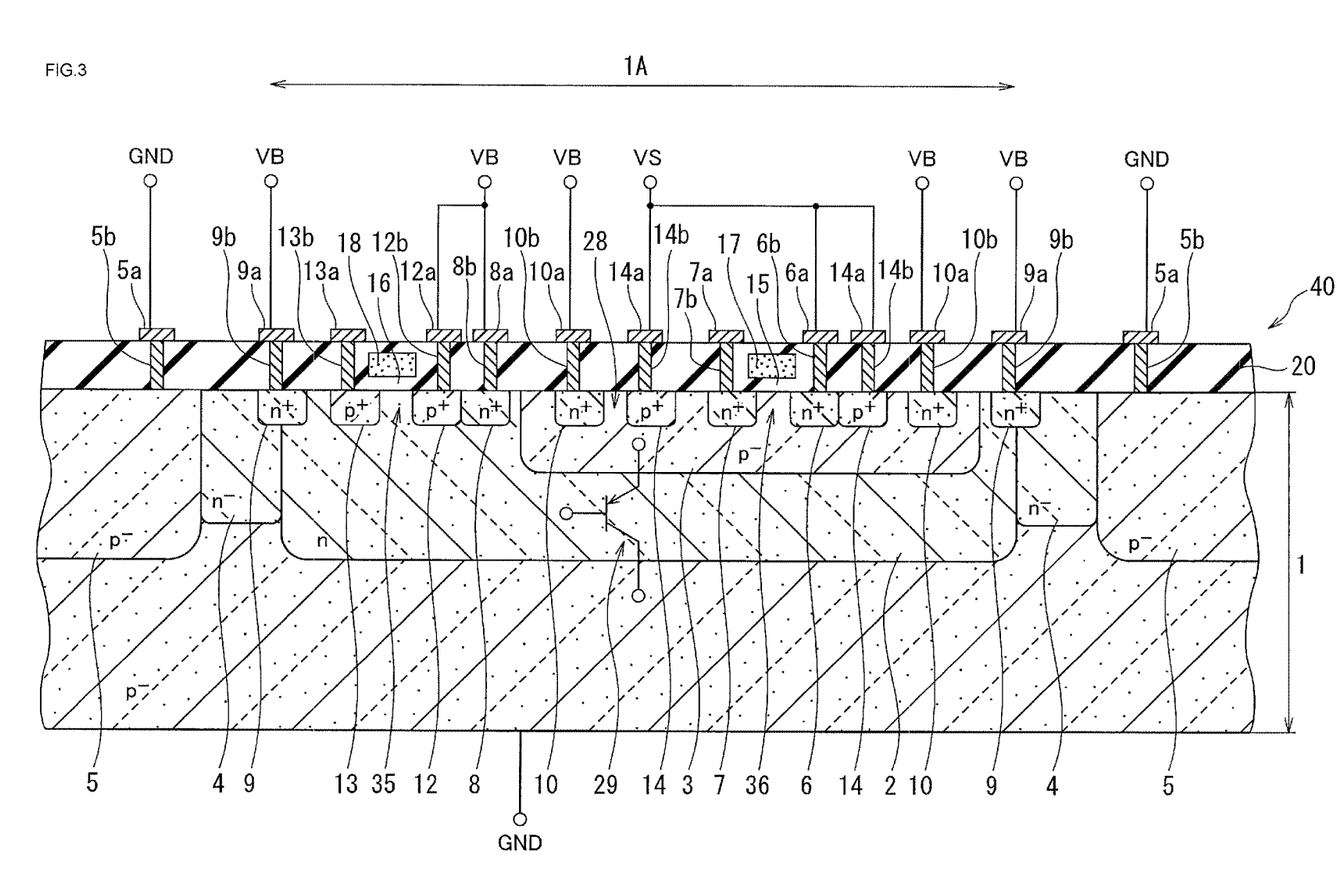
FIG. 3 is a cross sectional view showing a cross sectional structure taken along line IIa-IIa in FIG. 2.

FIG. 2 is a plan view showing a layout of semiconductor regions in a high-side forming region in the principal part of the semiconductor device according to the first embodiment of the invention and FIG. 3 is a cross sectional view showing a cross sectional structure taken along line IIa-IIa in FIG. 2.

As is shown in FIG. 2 and FIG. 3, the semiconductor device 40 according to the first embodiment forms power ICs in a semiconductor substrate 1 of the second conduction type (p$^-$-type) with an elements isolation structure formed by a self-isolation IC process. The semiconductor substrate 1 is formed of a single crystal silicon substrate, for example.

As is shown in FIG. 3, in the surface layer section on the principal surface side of the semiconductor substrate 1, a first well region 2 of the first conduction type (n-type) is formed, on the surface layer section of which a second well region 3 of the second conduction type (p$^-$-type) is formed. In the surface layer section on the principal surface side of the semiconductor substrate 1, a well region 4 of the first conduction type (n$^-$-type) and a well region 5 of the second conduction type (p$^-$-type) are further formed. The first well region 2 and the second well region 3 are provided in a high-side driving circuit forming region 1A in the semiconductor substrate 1.

As is shown in FIG. 2 and FIG. 3, the first well region 2 is surrounded by the well region 4 and is in contact therewith. The well region 4 is surrounded by the well region 5 and is in contact therewith. That is, the well region 4 is provided between the first well region 2 and the well region 5 and is in contact with each of them.

As is shown in FIG. 3, the pMOS 35 is a first active element formed in the surface layer section in the first well region 2 and the nMOS 36 is a second active element formed in the surface layer section in the second well region 3. The first well region 2 is an isolation region electrically isolating the pMOS 35 from the semiconductor substrate 1 and the second well region 3 is an isolation region electrically isolating the nMOS 36 from the first well region 2.

The pMOS 35 has a channel forming region formed of the first well region 2, a gate insulator 16 formed on the surface of the first well region 2 as the principal surface of the semiconductor substrate 1, a gate electrode 18 provided on the channel forming region with the gate insulator 16 provided in between, a first main electrode region (source region) 12 of the second conduction type (p$^+$-type) provided on the surface layer section of the first well region 2 and a second main electrode region (drain region) 13 of the second conduction type (p$^+$-type) provided on the surface layer section of the first well region 2 so as to be apart from the first main electrode region 12 with the channel forming region put in between.

The nMOS 36 has a channel forming region formed of the second well region 3, a gate insulator 15 formed on the surface of the second well region 3 as the principal surface of the semiconductor substrate 1, a gate electrode 17 provided on the channel forming region with the gate insulator 15 provided in between, a first main electrode region (source region) 6 of the first conduction type (n$^+$-type) provided on the surface layer section of the second well region 3 and a second main electrode region (drain region) 7 of the first conduction type (n$^+$-type) provided on the surface layer section of the second well region 3 so as to be apart from the first main electrode region 6 with the channel forming region put in between.

Each of the gate insulators 15 and 16 is formed of a silicon dioxide film, for example. Each of the gate electrodes 17 and 18 is formed of, for example, a polycrystalline silicon film into which impurities reducing the resistance value thereof are introduced. Each of the first main electrode region 12 and the second main electrode region 13 of the pMOS 35 is formed with an impurity concentration higher than that in the first well region 2. Each of the first main electrode region 6 and the second main electrode region 7 of the nMOS 36 is formed with an impurity concentration higher than that in the second well region 3.

The silicon dioxide films may be classified into thermal oxide films formed by thermal oxidation and deposition oxide films formed by chemical vapor deposition (CVD). In a MOSFET, thermal oxide films excellent in density are preferably used as the gate insulators 15 and 16. In the first embodiment, the case of using MOSFETs is explained in which each of the gate insulators 15 and 16 is formed of a silicon dioxide film. As transistors, however, the MOSFETs may be substituted by MISFETs in each of which a gate insulator is formed of a silicon nitride film or a stacked film with a silicon nitride film and a silicon oxide film.

In the surface layer section of the first well region 2, a first contact region 8 of the first conduction type (n$^+$-type) is selectively formed with the impurity concentration thereof higher than that of the first well region 2. In the surface layer sections of the first well region 2 and the well region 4, a contact region 9 of the first conduction type (n$^+$-type) is selectively formed over the first well region 2 and the well region 4. The contact region 9 is formed with the impurity concentration thereof higher than those of the first well region 2 and the well region 4.

In the surface layer section of the second well region 3, a second contact region 14 of the second conduction type is formed which has an impurity concentration higher than that of the second well region 3. In the surface layer section of the second well region 3, a charge extracting region 10 of the first conduction type is further formed which has an impurity concentration higher than that of the second well region 3.

On the principal surface of semiconductor substrate 1, an interlayer dielectric 20 is formed so as to cover the gate electrodes 17 and 18. On the interlayer dielectric 20, there are formed a grounding electrode 5a, a source electrode 6a, a drain electrode 7a, a contact electrode 8a, a contact electrode 9a, a charge extracting electrode 10a, a source electrode 12a, a drain electrode 13a and a contact electrode 14a. Each of the electrodes 5a to 14a is formed of an aluminum film.

The grounding electrode 5a is electrically connected to the well region 5 through a conductive plug 5b buried in the interlayer dielectric 20. The source electrode 6a is electrically connected to the first main electrode region (source region) 6 through a conductive plug 6b buried in the interlayer dielectric 20. The drain electrode 7a is electrically connected to the second main electrode region (drain region) 7 through a conductive plug 7b buried in the interlayer dielectric 20.

The contact electrode 8a is electrically connected to the first contact region 8 through a conductive plug 8b buried in the interlayer dielectric 20. The contact electrode 9a is electrically connected to the contact region 9 through a conductive plug 9b buried in the interlayer dielectric 20. The charge extracting electrode 10a is electrically connected to the charge extracting region 10 through a conductive plug 10b buried in the interlayer dielectric 20. The source electrode 12a is electrically connected to the first main electrode region (source region) 12 through a conductive plug 12b buried in the interlayer dielectric 20. The drain electrode 13a is electrically connected to the second main electrode region (drain region) 13 through a conductive plug 13b buried in the interlayer dielectric 20. The contact electrode 14a is electrically connected to the second contact region 14 through a conductive plug 14b buried in the interlayer dielectric 20.

The grounding electrode 5a is electrically connected to the GND terminal 46 shown in FIG. 1 to be at the grounding potential. That is, the well region 5 is at the grounding potential.

The source electrode 6a and the contact electrode 14a are electrically connected to the VS terminal 43 shown in FIG. 1 to have the voltage VS applied thereto. That is, to the first main electrode region 6 of the nMOS 36, the voltage VS is applied and to the second well region 3, the voltage VS is also applied through the second contact region 14.

The contact electrode 8a, the contact electrode 9a, the source electrode 12a and the charge extracting electrode 10a are electrically connected to the VB terminal 44 shown in FIG. 1 to have the voltage VB applied thereto. That is, to the first well region 2 and the well region 4, the voltage VB is applied through the contact region 9, provided over the first well region 2 and the well region 4, and through the first contact region 8 provided in the first well region 2, and to the first main electrode region 12 of the pMOS 35, the voltage VB is also applied. Furthermore, to the charge extracting region 10, the voltage VB is also applied.

As is shown in FIG. 2, the first contact region 8 is formed in an L-shape in the plane figure thereof and is arranged so that a portion extending along the longitudinal direction of the gate electrode 18 of the pMOS 35 contacts the first main electrode region (source region) 12 and the other portion except the contacting portion is apart from the first main electrode region 12 and the second main electrode region 13 of the pMOS 35.

The second contact region 14 is formed in a U-shape in the plane figure thereof and is arranged so as to surround the nMOS 36. The second contact region 14 is arranged so that one of portions extending along the longitudinal direction of the gate electrode 17 of the pMOS 36 contacts the first main electrode region (source region) 6 and the other portion except the contacting portion is apart from the first main electrode region 6 and the second main electrode region 7 of the pMOS 36.

The contact region 9 is formed in a frame-like shape in the plane figure thereof so as to surround the pMOS 35 and the nMOS 36.

The charge extracting region 10 is formed in a frame-like shape in the plane figure thereof so as to surround the nMOS 36 and the nMOS 36. The charge extracting region 10 is arranged, as is shown in FIG. 2 and FIG. 3, on the outside of the second contact region 14 in proximity thereto, that is, adjacent to the second contact region 14. The charge extracting region 10 is further arranged apart from the first contact region 8 and the second contact region 14 between the first contact region 8 and the second contact region 14. The charge extracting region 10 is formed to be shallower than the second well region 3 as is shown in FIG. 3 and is provided so as to be apart from the first well region 2 in the direction of thickness of the semiconductor substrate 1, in other words, so as to make the second well region 3 presented between the charge extracting region 10 and the first well region 2.

As is shown in FIG. 3, on the inside of the second well region 3 of the p⁻-type, the second contact region 14 of the p⁺-type and the charge extracting region 10 of the n⁺-type are provided adjacent to each other. Therefore, on the surface layer section of the second well region 3, a p-i-n diode (p-intrinsic-n Diode) 28 is formed with the second contact region 14 of the p⁺-type and the second well region 3 taken as the anode region and the charge extracting region 10 of the n⁺-type taken as the cathode region.

The voltage VB as the first voltage and the voltage VS as the second voltage are voltages with which the p-n junction between the first well region 2 and the second well region 3 is inversely biased in a normal operation of the semiconductor device 40.

For fabricating the semiconductor device 40 according to the first embodiment, a self-isolation IC process is used. In the semiconductor device 40 fabricated by the self-isolation IC process, a parasitic pnp bipolar transistor 29, formed of the second well region 3 of the p⁻-type, the first well region 2 of the n-type and the semiconductor substrate 1 of the p⁻-type, is formed in the high-side driving circuit forming region 1A as is shown in FIG. 3. The base, the emitter and the collector of the parasitic pnp bipolar transistor 29 become in states of being connected to the VB terminal 44, the VS terminal 43 and the GND terminal 46, respectively.

In a normal operation of the semiconductor device 40, the voltage VB as the power supply voltage is higher than the voltage VS as an intermediate voltage, by which no parasitic pnp bipolar transistor 29 is operated. However, when the voltage VB is lowered less than the voltage VS due to a negative voltage surge by 0.6V as the diffusion potential at the p-n junction of silicon or more, that is, when the voltage VB and the voltage VS becomes in a relation expressed as voltage VB<(voltage VS−0.6V), the parasitic pnp bipolar transistor 29 becomes in a turned-on state. This causes a large current to flow in a related semiconductor device (high breakdown voltage IC) between the VS terminal 43, to which a high voltage on the high-side circuit side (the high voltage side voltage of the high voltage main power supply HV) is applied, and the GND terminal 46, i.e. from the second well region 3 to the semiconductor substrate 1. Thus, heat generation by the large current causes the semiconductor device 40 to malfunction to make the device 40 less reliable.

Compared with this, in the semiconductor device 40 according to the first embodiment of the invention, the charge extracting region 10 is provided in the second well region 3 and the voltage VB for the high-side circuit is applied to the charge extracting region 10. Therefore, when the voltage VB is lowered less than the voltage VB due to a negative voltage surge by 0.6V as the diffusion potential at the p-n junction of silicon or more, the p-i-n diode 28 with the second contact region 14 of the p+-type and the second well region 3 of the p−-type taken as the anode region thereof and with the charge extracting region 10 of the n+-type taken as the cathode region thereof is biased in the forward direction to allow a current to flow in the p-i-n diode 28. In other words, the current can be extracted by the charge extracting region 10. Therefore, a current flowing into the parasitic pnp bipolar transistor 29 can be reduced to inhibit the operation of the parasitic pnp bipolar transistor 29. As a result, a malfunction occurring in the semiconductor device 40 due to heat generation by a large current can be prevented to enhance the reliability of the semiconductor device 40 according to the first embodiment.

The charge extracting region 10 is formed to be shallower than the second well region 3. This is because the charge extracting region 10 formed to be deeper than the second well region 3, i.e. formed to be in contact with the first well region 2, causes the charge extracting region 10 and the first well region 2 to be brought into conduction to make the charge extracting region 10 become a part of the parasitic pnp bipolar transistor 29 to lose the effect of inhibiting the operation of the parasitic pnp bipolar transistor 29.

The p-i-n diode 28 with the second contact region 14 of the p+-type and the second well region 3 of the p−-type taken as the anode region thereof and with the charge extracting region 10 of the n+-type taken as the cathode region thereof is biased in the reverse direction in a normal state unaffected by noises. In the state of being biased in the reverse direction, it is necessary to keep a breakdown voltage so that no current flows. In the semiconductor device 40 according to the first embodiment, the second contact region 14 and the charge extracting region 10 are made apart and the second well region 3 with the impurity concentration thereof lower than that of the second contact region 14 is arranged between the second contact region 14 and the charge extracting region 10. Thus, the breakdown voltage can be maintained so that no current flows in the state of being biased in the reverse direction.

When the voltage VB is lowered less than the voltage VS by 0.6V or more by a negative voltage surge, one end of the current path of the parasitic pnp bipolar transistor 29 is the second contact region 14. In the semiconductor device 40 according to the first embodiment, the charge extracting region 10 is provided so as to surround the periphery of the second contact region 14. Thus, before a current flows into the parasitic pnp bipolar transistor 29, the current can be effectively extracted into the charge extracting region 10, by which the effect of inhibiting the operation of the parasitic pnp bipolar transistor 29 can be enhanced.

When the voltage VB is lowered less than the voltage VS by 0.6V or more by a negative voltage surge, the base current of the parasitic pnp bipolar transistor 29 flows to the first contact region 8 to which the voltage VB is applied. In the semiconductor device 40 according to the first embodiment, the charge extracting region 10 is provided between the second contact region 14 and the first contact region 8. This can inhibit the base current flowing to the first contact region 8. As a result, the effect of inhibiting the operation of the parasitic pnp bipolar transistor 29 can be enhanced.

Here, in general, the pMOS 35 has the first main electrode region 12 as the source region electrically connected to the VB terminal 44 and has the second main electrode region 13 as the drain region electrically connected to the second main electrode region 7 as the drain region of the nMOS 36. This, when the pMOS 35 is in a turned-on state, makes the voltage VB applied to the second main electrode region 7 as the drain region of the nMOS 36 through the pMOS 35 to conceivably give effect of inhibiting the operation of the parasitic pnp bipolar transistor 29. In this case, however, the effect of the inhibition results in the dependence on whether the pMOS 35 is in a turned-on state or not. In addition, the effect of the inhibition is affected by the on-state resistance of the pMOS 35.

Compared with this, in the semiconductor device 40 according to the first embodiment, the charge extracting region 10 is electrically connected directly to the VB terminal 44 with the pMOS 35 being bypassed. Therefore, the operation of the driving circuit (power IC) in which the operation of the parasitic pnp bipolar transistor 29 is inhibited can be actualized without being dependent on whether the pMOS 35 is in a turned-on state or not and affected by the on-state resistance of the pMOS 35.

(Second Embodiment)

Figure 4:
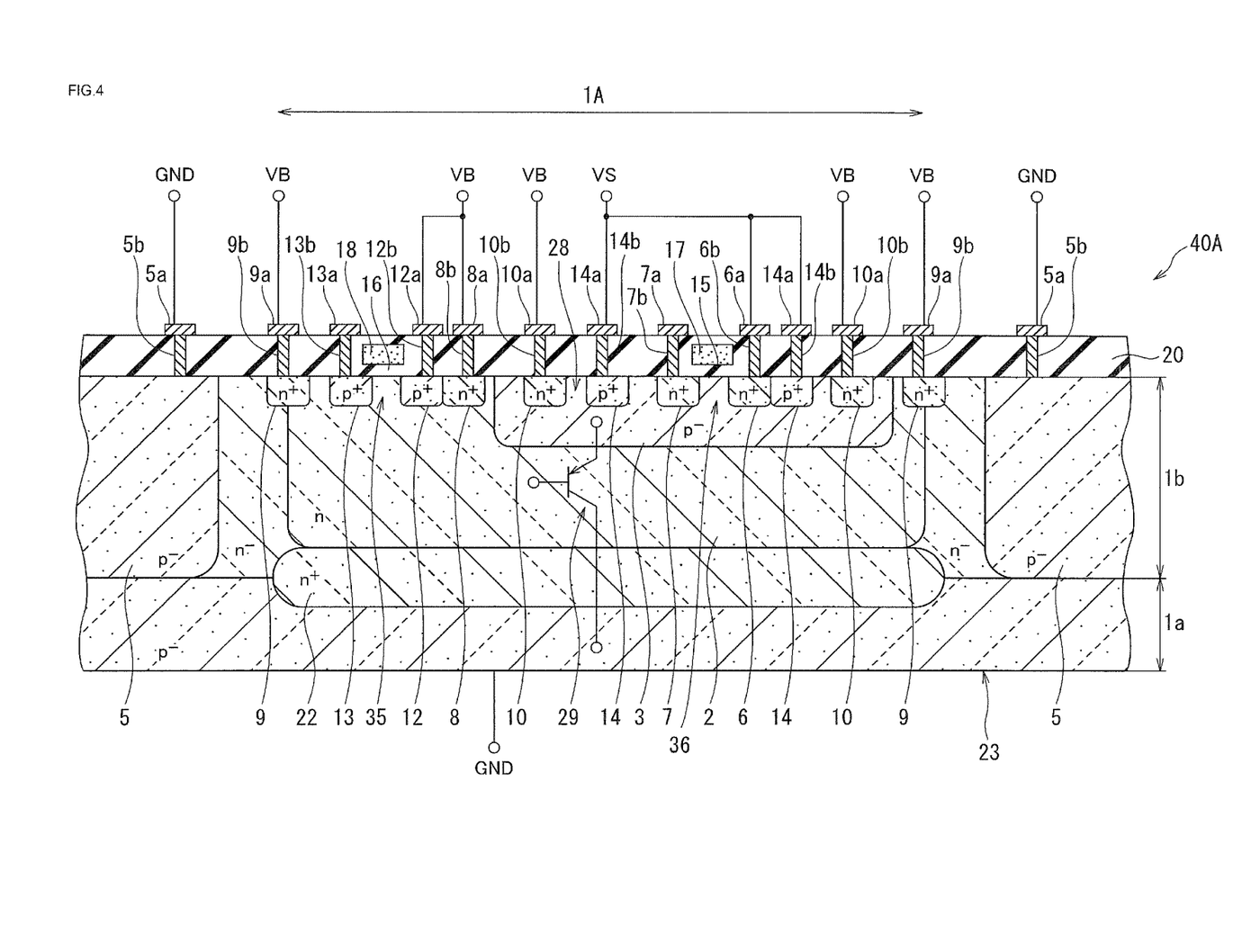
FIG. 4 is a cross sectional view showing a cross sectional structure in the principal part of a semiconductor device according to a second embodiment of the invention.

FIG. 4 is a cross sectional view showing a cross sectional structure in the principal part of a semiconductor device 40A according to a second embodiment of the invention.

The semiconductor device 40A according to the second embodiment of the invention has approximately the same structure as the structure of the semiconductor device 40 according to the first embodiment except that the structure of the semiconductor substrate is different.

Namely, in the semiconductor device 40 according to the first embodiment, as is shown in FIG. 3, the semiconductor substrate 1 of the p−-type was used. Compared with this, in the semiconductor device 40A according to the second embodiment, as is shown in FIG. 4, a semiconductor base 23 is used in which a semiconductor layer 1b of the first conduction type (n−-type) is provided on a semiconductor substrate 1a of the second conduction type (p−-type). In the high-side driving circuit forming region 1A of the semiconductor base 23, between the semiconductor substrate 1a and the semiconductor layer 1b, a buried region 22 of the first conduction type (n+-type) is formed the impurity concentration of which is higher than those in the semiconductor substrate 1a and the semiconductor layer 1b.

The first well region 2 and the well region 5 are formed in the semiconductor layer 1b. The first well region 2 is formed in the semiconductor layer 1b on the buried region 22 so as to be in contact with the buried region 22. In the semiconductor device 40 according to the first embodiment, the structure thereof is formed in which the well region 4 is provided between the first well region 2 and the well region 5. In the semiconductor device 40A according to the second embodiment, however, the semiconductor layer 1b is provided between the first well region 2 and the well region 5 instead of the well region 4. Therefore, the contact region 9 of the n+-type is formed in the surface layer sections of the first well region 2 and the semiconductor layer 1b over the first well region 2 and the semiconductor layer 1b. The structure other than this is the same as that in the first embodiment.

In the semiconductor device 40A according to the second embodiment, in the high-side driving circuit forming region 1A, the buried region 22 with a high impurity concentration is provided between the semiconductor substrate 1a and the semiconductor layer 1b so as to be in contact with the first well region 2. Therefore, the impurity concentration in the base of the parasitic pnp bipolar transistor 29 becomes high, by which the current-amplification factor $h_{FE}$ can be reduced to make it possible to inhibit the operation of the parasitic pnp bipolar transistor 29.

Furthermore, the semiconductor device 40A according to the second embodiment is, like the semiconductor device 40 according to the first embodiment, provided with the charge extracting region 10, to which the voltage VB is applied, in the second well region 3 in the high-side driving circuit forming region 1A. Therefore, like in the semiconductor device 40 according to the first embodiment, the operation of the parasitic pnp bipolar transistor 29 can be inhibited. As a result, compared with the semiconductor device 40 according to the first embodiment, the semiconductor device 40A according to the second embodiment can further inhibit the operation of the parasitic pnp bipolar transistor 29.

(Third Embodiment)

Figure 5:
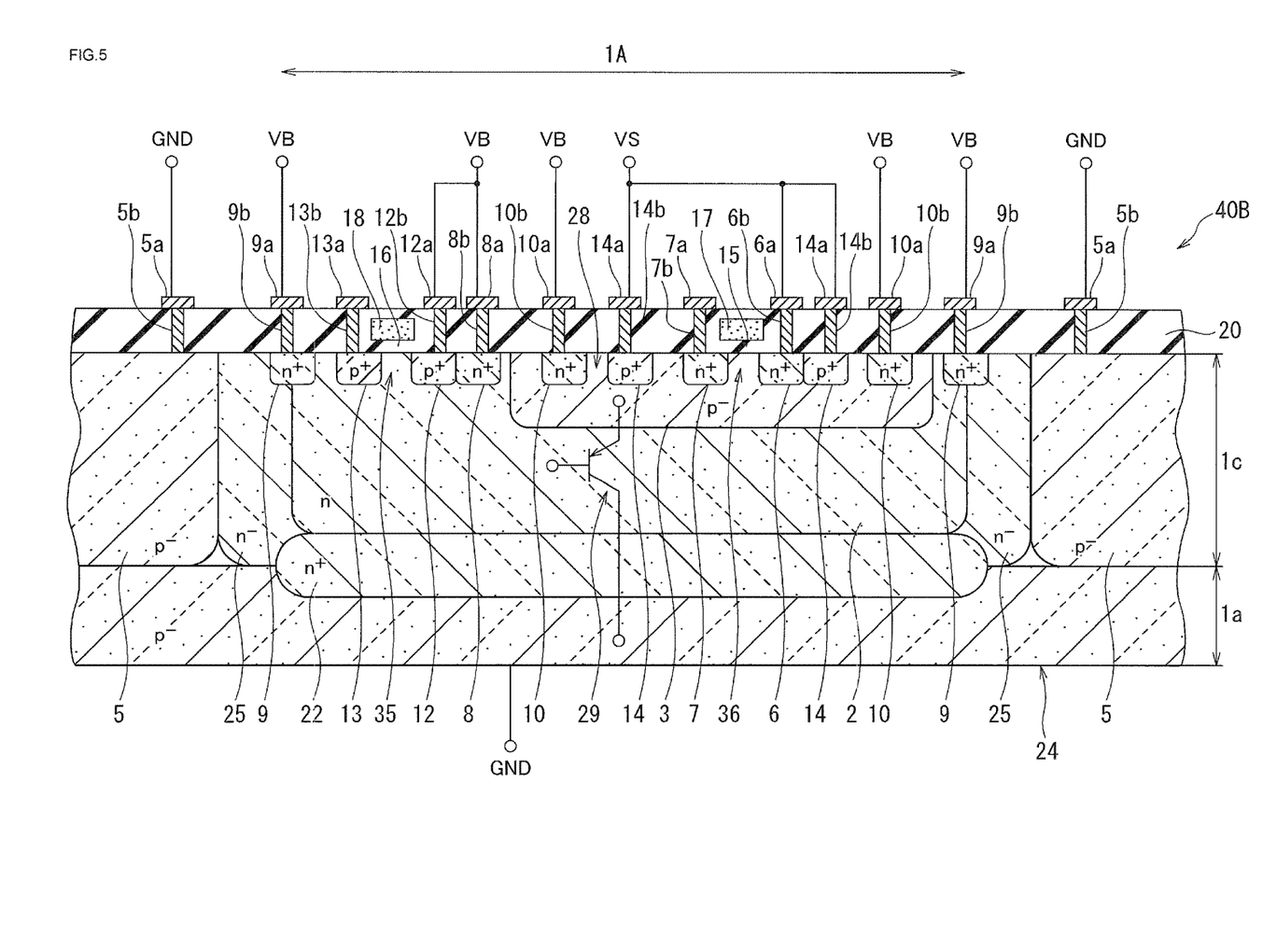
FIG. 5 is a cross sectional view showing a cross sectional structure in the principal part of a semiconductor device according to a third embodiment of the invention.

FIG. 5 is a cross sectional view showing a cross sectional structure in the principal part of a semiconductor device 40B according to a third embodiment of the invention.

The semiconductor device 40B according to the second embodiment of the invention has approximately the same structure as the structure of the semiconductor device 40A according to the second embodiment except that the structure of the semiconductor base is different.

Namely, in the semiconductor device 40A according to the second embodiment, as is shown in FIG. 4, the semiconductor base 23 was used in which the semiconductor layer 1b of the n⁻-type is provided on the semiconductor substrate 1a of the p⁻-type. Compared with this, in the semiconductor device 40B according to the third embodiment, as is shown in FIG. 5, a semiconductor base 24 is used in which a semiconductor layer 1c of the second conduction type (p⁻-type) is provided on the semiconductor substrate 1a of the second conduction type (p⁻-type). In the high-side driving circuit forming region 1A of the semiconductor base 24, between the semiconductor substrate 1a and the semiconductor layer 1c, the buried region 22 of the first conduction type (n⁺-type) is formed the impurity concentration of which is higher than those in the semiconductor substrate 1a and the semiconductor layer 1c.

The well region 5 is formed in the semiconductor layer 1c. In the semiconductor layer 1c, a well region 25 of the first conduction type (n⁻-type) is formed. The first well region 2 is formed in the well region 25. Moreover, in the well region 25, the first well region 2 is formed on the buried region 22 so as to be in contact with the buried region 22. In the semiconductor device 40A according to the second embodiment, the structure thereof is provided in which the semiconductor layer 1b is provided between the first well region 2 and the well region 5. In the semiconductor device 40B according to the third embodiment, however, instead of the semiconductor layer 1b, the well region 25 is provided between the first well region 2 and the well region 5. Therefore, the contact region 9 of the n⁺-type is formed in the surface layer sections of the first well region 2 and the well region 25 over the first well region 2 and the well region 25. The structure other than this is the same as that in the semiconductor device 40A according to the second embodiment.

In the semiconductor device 40B according to the third embodiment, in the high-side driving circuit forming region 1A, the buried region 22 with a high impurity concentration is provided between the semiconductor substrate 1a and the semiconductor layer 1c so as to be in contact with the first well region 2. Therefore, the impurity concentration in the base of the parasitic pnp bipolar transistor 29 becomes high, by which the current-amplification factor $h_{FE}$ can be reduced to make it possible to inhibit the operation of the parasitic pnp bipolar transistor 29.

Furthermore, the semiconductor device 40B according to the third embodiment is, like the semiconductor device 40 according to the first embodiment, provided with the charge extracting region 10, to which the voltage VB is applied, in the second well region 3 in the high-side driving circuit forming region 1A. Therefore, like in the semiconductor device 40 according to the first embodiment, the operation of the parasitic pnp bipolar transistor 29 can be inhibited. As a result, compared with the semiconductor device 40 according to the first embodiment, the semiconductor device 40B according to the third embodiment can further inhibit the operation of the parasitic pnp bipolar transistor 29.

(Fourth Embodiment)

Figure 6:
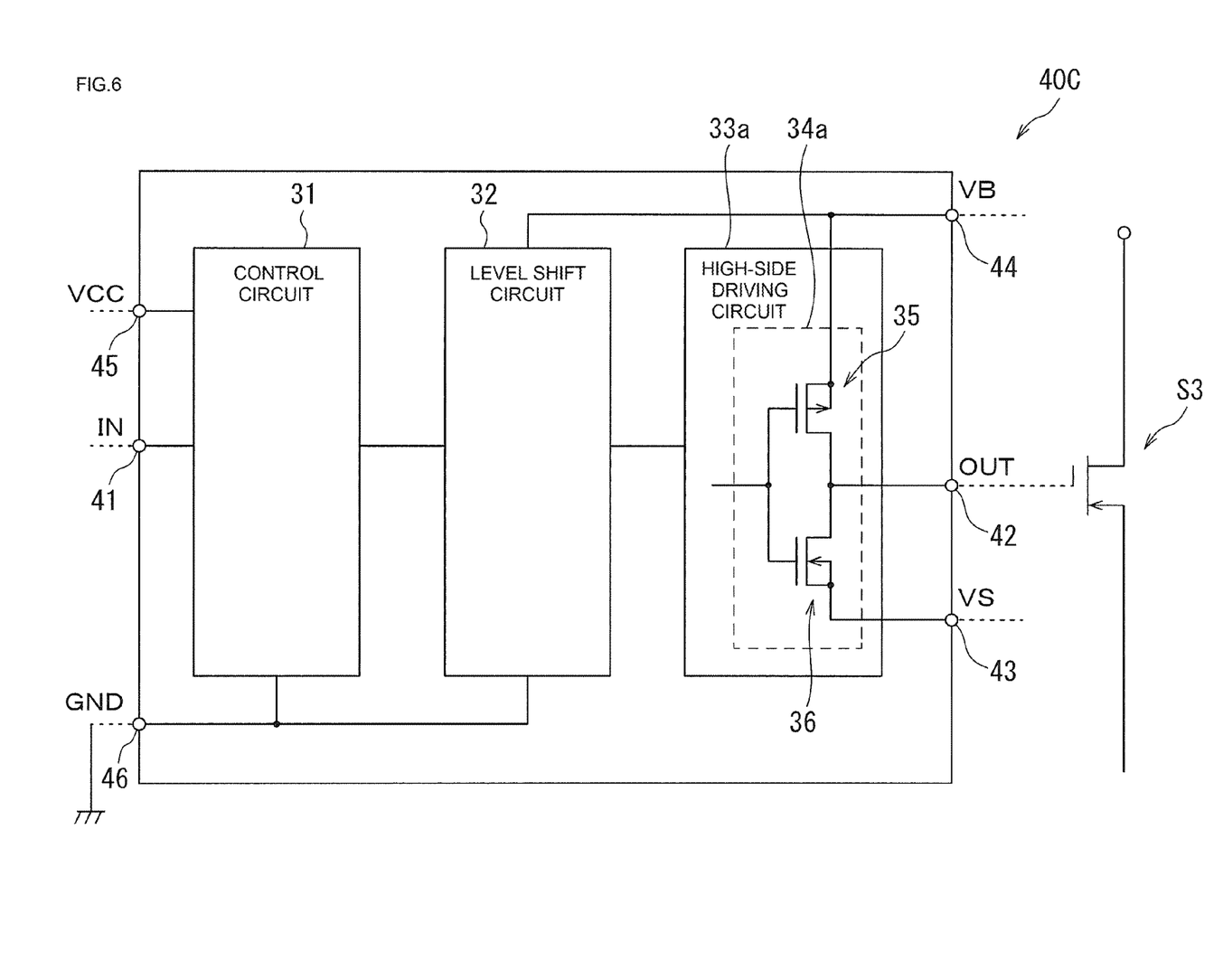
FIG. 6 is a circuit diagram showing a schematic configuration of a semiconductor device according to a fourth embodiment of the invention.
Figure 7:
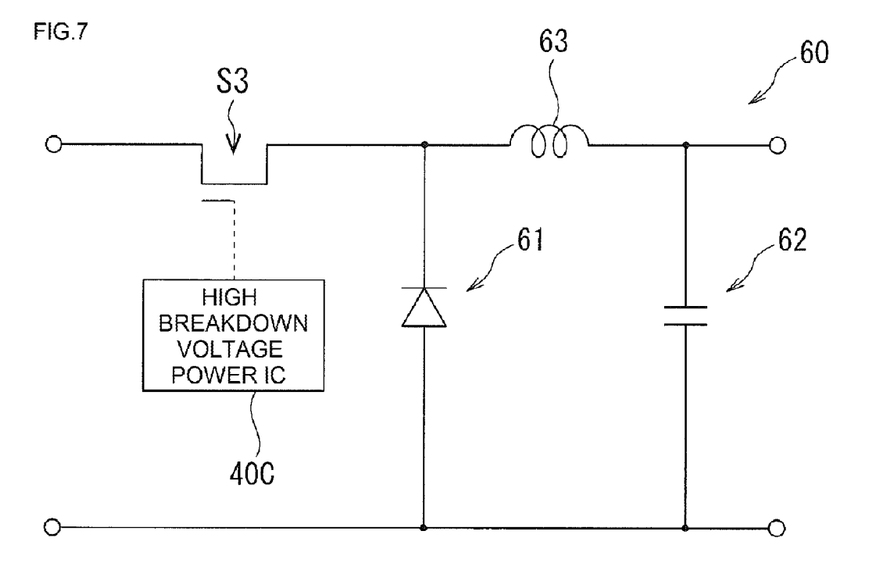
FIG. 7 is a circuit diagram showing a schematic configuration of a step-down converter using the semiconductor device according to the fourth embodiment of the invention.

FIG. 6 is a circuit diagram showing a schematic configuration of a semiconductor device 40C according to a fourth embodiment of the invention and FIG. 7 is a circuit diagram showing a schematic configuration of a step-down converter 60 using the semiconductor device 40C according to the fourth embodiment of the invention.

As is shown in FIG. 6, the semiconductor device 40C according to the fourth embodiment of the invention is a driving circuit formed of a power IC provided with the control circuit 31, the level shift circuit 32 and a driving circuit 33a etc. The semiconductor device 40C, as is shown in FIG. 7, drives a switching element S3 in the step-down converter 60, for example, as a driving object. The step-down converter 60 is formed of a diode 61, a capacitor 62, a coil 63 and the switching element S3. The switching element S3 is formed of an active device such as a MOSFET or an IGBT.

In FIG. 6, the driving circuit 33a is provided with a gate driving circuit 34a. The gate driving circuit 34a has the same configuration as that of the gate driving circuit 34 in the semiconductor device 40 according to the first embodiment. Specifically, the source of the pMOS 35 is connected to the VB terminal 44 and the drain of the pMOS 35 is connected to the drain of the nMOS 36. The source of the nMOS 36 is connected to the VS terminal 43. To the connection point of the pMOS 35 and the nMOS 36, the gate of the switching element S3 is connected which forms the step-down converter 60 shown in FIG. 7.

In FIG. 6, the gate driving circuit 34a is operated with the voltage VS applied to the VS terminal 43 taken as a reference voltage and with the voltage VB as a first voltage applied to the VB terminal 44 taken as a power supply voltage to output a driving signal from the output terminal 42 on the basis of a signal received from the level shift circuit 32 to thereby drive the switching element S3 of the step-down converter 60.

Also in the semiconductor device 40C according to the fourth embodiment that drives the switching element S3 in the step-down converter 60 in this way, the operation of the parasitic pnp bipolar transistor 29, formed of the second well region 3 of the p⁻-type, the first well region 2 of the n⁻-type and the semiconductor substrate 1 of the p⁻-type, can be inhibited like in the semiconductor device 40 according to the first embodiment as was explained with reference to FIG. 3.

In the fourth embodiment, the semiconductor device 40C was explained as a semiconductor device driving the switching element S3 of the step-down converter 60. The invention, however, is not limited to this, but can be applied to semiconductor devices that drive switching elements in such converters as a step-up-and-down converter, a flyback converter and a forward converter.

While the present invention has been particularly shown and described with reference to embodiments thereof, it will be understood by those skilled in the art that the foregoing and other changes in form and details can be made therein without departing from the spirit and scope of the present invention as defined in the claims and their equivalents.

What is claimed is:

1. A semiconductor device comprising:
    a first well region of a first conduction type formed in a surface layer section of a semiconductor substrate and configured to receive a first voltage;
    a second well region of a second conduction type formed in a surface layer section of the first well region and configured to receive a second voltage different from the first voltage;
    a charge extracting region of the first conduction type formed in a surface layer section of the second well region and configured to receive the first voltage;
    a region of the second conduction type in the semiconductor substrate and underneath the first well region;
    a first contact region of the first conduction type, and of a higher impurity concentration than that of the first well region, formed in the surface layer section of the first well region and configured to receive the first voltage; and
    a second contact region of the second conduction type, and of a higher impurity concentration than that of the second well region, formed in the surface layer section of the second well region and configured to receive the second voltage, the second contact region having the charge extracting region arranged in proximity thereto.

2. The semiconductor device as claimed in claim 1, comprising a parasitic bipolar transistor structure comprised of the second well region, the first well region, and the region of the second conduction type underneath the first well region.

3. The semiconductor device as claimed in claim 2, wherein the first voltage and the second voltage are voltages which cause a p-n junction between the first well region to which the first voltage is applied and the second well region to which the second voltage is applied to be reverse-biased in a normal operation.

4. The semiconductor device as claimed in claim 1, wherein the charge extracting region is formed to be shallower than the second well region.

5. The semiconductor device as claimed in claim 1, wherein the charge extracting region is arranged between the first contact region and the second contact region.

6. The semiconductor device as claimed in claim 1, wherein the charge extracting region is formed so as to surround the second contact region.

7. A semiconductor device comprising:
    a first well region of a first conduction type configured to receive a first voltage and formed in a surface layer section of a semiconductor layer formed on a principal surface of a semiconductor substrate of a second conduction type with a buried region of the first conduction type provided in between;
    a second well region of the second conduction type formed in a surface layer section of the first well region and configured to receive a second voltage different from the first voltage; and
    a charge extracting region of the first conduction type formed in a surface layer section of the second well region and configured to receive the first voltage.

8. The semiconductor device as claimed in claim 7, wherein the first voltage and the second voltage are voltages which cause a p-n junction between the first well region to which the first voltage is applied and the second well region to which the second voltage is applied to be reverse-biased in a normal operation.

9. The semiconductor device as claimed in claim 7, wherein the charge extracting region is formed to be shallower than the second well region.

10. The semiconductor device as claimed in claim 7, further comprising:
    a first contact region of the first conduction type which is formed in the surface layer section of the first well region and configured to receive the first voltage; and
    a second contact region of the second conduction type which is formed in the surface layer section of the second well region and configured to receive the second voltage, the second contact region having the charge extracting region arranged in proximity thereto.

11. A semiconductor device comprising:
    a first well region of a first conduction type configured to receive a first voltage;
    a second well region of a second conduction type formed in a surface layer section of the first well region and configured to receive a second voltage different from the first voltage;
    a charge extracting region of the first conduction type formed in a surface layer section of the second well region and configured to receive the first voltage;
    a first active element comprising
        a first electrode region of the second conduction type provided in the surface layer section of the first well region, and
        a second electrode region of the second conduction type provided in the surface layer section of the first well region; and
    a second active element comprising
        a first electrode region of the first conduction type provided in the surface layer section of the second well region, and
        a second electrode region of the first conduction type provided in the surface layer section of the second well region.

12. The semiconductor device as claimed in claim 11, wherein
    the first active element comprises
        a channel region of the first conduction type, the channel region of the first conduction type being a portion of the first well region between the first and second electrode regions of the second conduction type, and
        a gate electrode configured to form a channel in the channel region of the first conduction type, and
    the second active element comprises
        a channel region of the second conduction type, the channel region of the second conduction type being a portion of the second well region between the first and second electrode regions of the first conduction type, and
        a gate electrode configured to form a channel in the channel region of the second conduction type.

13. The semiconductor device as claimed in claim 11, further comprising a gate driving circuit in which the first active element and the second active element are connected in series,
    the gate driving circuit having a switching element as a driving object, and having the gate of the switching element connected to the connection point of the first active element and the second active element.

14. The semiconductor device as claimed in claim 11, further comprising a gate driving circuit in which the first active element and the second active element are connected in series, the gate driving circuit having a high-side circuit, in which a high voltage side switching element and a low voltage side switching element are connected in series, as a driving object, and having a gate of the high voltage side switching element connected to a connection point of the first active element and the second active element.

15. The semiconductor device as claimed in claim 13, wherein the first active element and the second active element are connected with their respective second electrode regions, the first active element has the first voltage applied to the first electrode region thereof, and the second active element has the second voltage applied to the first electrode region thereof.

16. The semiconductor device as claimed in claim 14, wherein the first active element and the second active element are connected with their respective second electrode regions, the first active element has the first voltage applied to the first electrode region thereof, and the second active element has the second voltage applied to the first main electrode region thereof.

\* \* \* \* \*